United States Patent [19]

Arakawa et al.

[11] Patent Number: 5,757,833
[45] Date of Patent: May 26, 1998

[54] SEMICONDUCTOR LASER HAVING A TRANSPARENT LIGHT EMITTING SECTION, AND A PROCESS OF PRODUCING THE SAME

[75] Inventors: Satoshi Arakawa; Norihiro Iwai, both of Tokyo; Takuya Ishikawa, Kawasaki; Akihiko Kasukawa, Tokyo; Michio Ohkubo, Fujisawa; Takao Ninomiya, Yokohama, all of Japan

[73] Assignee: The Furukawa Electric Co., Ltd., Tokyo, Japan

[21] Appl. No.: 742,866

[22] Filed: Nov. 1, 1996

[30] Foreign Application Priority Data

Nov. 6, 1995 [JP] Japan ................... 7-286958

[51] Int. Cl.$^6$ ............... H01S 3/19; H01L 21/20
[52] U.S. Cl. ............... 372/45; 438/33; 438/44; 372/46
[58] Field of Search ............... 372/43, 44, 45, 372/46, 50; 438/33, 41, 44

[56] References Cited

U.S. PATENT DOCUMENTS

| 5,426,658 | 6/1995 | Kaneno et al. | 372/45 |
| 5,486,490 | 1/1996 | Kakimoto | 438/33 |
| 5,574,289 | 11/1996 | Aoki et al. | 372/50 |
| 5,657,338 | 8/1997 | Kitamura | 372/50 |

FOREIGN PATENT DOCUMENTS

| 2-62090 | 3/1990 | Japan | 372/46 |
| 4-303982 A | 10/1992 | Japan | |
| 6-196797 A | 7/1994 | Japan | |

OTHER PUBLICATIONS

Article entitled "High power, AlGaAs buried heterostructure lasers with flared waveguides", by D.F. Welch et al., Appl. Phys. Lett., vol. No. 50, No. 5, 2 Feb. 1987.

*Primary Examiner*—Rodney B. Bovernick
*Assistant Examiner*—Luong-Quyen T. Phan
*Attorney, Agent, or Firm*—Frishauf, Holtz, Goodman, Langer & Chick

[57] ABSTRACT

A semiconductor laser is produced by forming a laser activation section and a light emitting section having an InGaAsP layer as a quantum well on a GaAs substrate according to metal organic chemical vapor deposition by using a selective area growth mask, in such a manner that the laser activation section and the light emitting section have different film thicknesses. The laser activation section includes a laser activation layer whose oscillation wavelength is set to 0.8 to 1.1 μm, and the light emitting section includes an optical waveguide layer having a broader forbidden band than the laser activation layer.

7 Claims, 8 Drawing Sheets

SEMICONDUCTOR LASER HAVING A TRANSPARENT LIGHT EMITTING SECTION, AND A PROCESS OF PRODUCING THE SAME

BACKGROUND OF THE INVENTION

1. Field of the Invention

The present invention relates to a semiconductor laser provided with a light emitting section which has transparency with respect to the laser oscillation wavelength and which also can emit a narrow circular beam with a large spot size, and more particularly, to a semiconductor laser of monolithic structure suited for obtaining higher light output. The present invention also relates to a simplified process for producing such a semiconductor laser.

2. Description of the Related Art

In general, if the light output of a semiconductor laser with a structure having, for example, InGaP layers and InGaAs layers formed on a GaAs substrate is increased, catastrophic optical damage is caused or the characteristics of the semiconductor laser deteriorate. It is therefore difficult to increase the light output, and conventional semiconductor laser devices generally have a maximum light output of about 200 mW.

To solve the problem, it has been proposed to provide a semiconductor laser with a light emitting section which has transparency with respect to the laser oscillation wavelength. For example, an attempt has been made to form a thin film of a material having large bandgap energy by epitaxial growth on a light emitting surface, which is an end face obtained by vertically cleaving a multilayer film formed on the substrate, so as to impart transparency active at the laser oscillation wavelength to the light emitting section and thereby prevent the catastrophic optical damage (COD).

FIG. 10 illustrates a typical example of conventional semiconductor laser structure. This semiconductor laser has a multilayer structure obtained by successively forming, on a GaAs substrate 11, an n-type InGaP layer 12 serving as a lower cladding layer, an InGaAs/InGaAsP layer 13 including a strain quantum well and serving as a laser activation layer, a p-type InGaP layer 14 serving as an upper cladding layer, and a p-type GaAs layer 15 serving as a contact (cap) layer. A negative electrode of the semiconductor laser is formed by depositing an Au-Ge-Ni/Au layer 16 on the back surface or underside of the GaAs substrate 11, and a positive electrode is formed by depositing a Ti-Pt-Au layer 17 on the surface of the p-type InGaAs layer 15. An InGaP layer, for example, is formed by epitaxial growth on a vertically cleaved end face of the multilayer film which later serves as a light emitting surface, to obtain a transparent thin film 18 having large bandgap energy (broad forbidden band).

The temperature range for the epitaxial growth of the transparent thin film 18 made of the InGaP layer is between 400° to 580° C., or thereabout. Therefore, in the step of growing the InGaP layer 18, the electrode made of the Au-Ge-Ni/Au layer 16 or of the Ti-Pt-Au layer 17 can possibly be melted. In addition, when the transparent thin film 18 is formed, the InGaP layer grows also on the electrodes, making it necessary to remove the InGaP layer on the electrodes at a later stage.

Thus, the process of producing semiconductor lasers is complicated. Also, the yield of semiconductor lasers is low and the semiconductor lasers produced have low reliability.

Unexamined Japanese Patent Publications (KOKAI) No. 6-196797 and No. 4-303982 disclose optical integrated devices of monolithic structure, wherein a dielectric mask with a varying width is selectively formed on an InP substrate in such a manner that a semiconductor laser region and a modulator region to be formed on the substrate are situated between the mask regions, and a multilayer film is grown by metal organic chemical vapor deposition on the InP substrate having the mask formed thereon, so that the multilayer film has different thicknesses at the semiconductor laser region and the modulator region and its activation layer has different bandgap energy levels at these regions. The metal organic chemical vapor deposition process using a selective area growth mask as disclosed in these publications makes the thickness of the multilayer film and the bandgap energy locally vary in accordance with the mask width, and thus is very useful in producing semiconductor devices.

In the case of fabricating a high-output semiconductor laser with an oscillation wavelength of 0.8 to 1.1 μm, a device structure is usually employed in which an InGaAs layer is grown as a quantum well on a GaAs substrate. Since the InGaAs layer has a small indium (In) content, however, a sufficient masking effect cannot be achieved even if a multilayer film is grown on the GaAs substrate by the metal organic chemical vapor deposition process using a selective area growth mask. Namely, the thickness of the InGaAs layer on the GaAs substrate cannot be greatly changed, making it impossible to impart sufficient transparency to the light emitting section. Also, if the proportion of indium (In) in the InGaAs layer is increased, another problem arises in that large strain is caused.

SUMMARY OF THE INVENTION

An object of the present invention is to provide a semiconductor laser with a monolithic structure which has a transparent light emitting section and which permits increase of the light output, and also to provide a simplified process for producing such semiconductor lasers with improved yield.

A semiconductor laser according to the present invention has a device structure wherein a multilayer film including an InGaAsP layer as a quantum well is grown on a GaAs substrate and a laser activation section and a light emitting section have different film thicknesses. The laser activation section and the light emitting section with different film thicknesses are formed by growing the multilayer film according to metal organic chemical vapor deposition by using a selective area growth mask formed on the GaAs substrate. The laser activation section includes a laser activation layer whose oscillation wavelength is adjusted to 0.8 to 1.1 μm, and the light emitting section includes an optical waveguide layer having a broader forbidden band than the laser activation layer and thus has transparency with respect to the laser oscillation wavelength.

As the laser activation layer of the laser activation section and the optical waveguide layer of the light emitting section, an $In_{1-x}Ga_xAs_yP_{1-y}$ layer is grown, where x indicates the proportion of Group III elements satisfying the relation of $0<x<1$, and y indicates the proportion of Group V elements satisfying the relation of $0<y<1$. The proportion x of the Group III elements preferably falls within the range of 0.5 to 0.8.

In brief, a device structure is employed wherein an $In_{1-x}Ga_xAs_yP_{1-y}$ layer with a varying film thickness is formed on the GaAs substrate according to metal organic chemical vapor deposition by using the selective area growth mask to obtain a laser activation layer and an optical waveguide layer contiguous with each other. The optical waveguide layer contiguous with the laser activation layer forms the light emitting section has transparency active at the laser oscillation wavelength, permitting the output of the semiconductor laser to be increased.

According to the present invention, there is also provided a process of producing a semiconductor laser having the aforementioned device structure and provided with a light emitting section having transparency with respect to a laser oscillation wavelength. In this process, a selective area growth mask is formed on a GaAs substrate except for a region where a light emitting section is to be formed in such a manner that a region where a laser activation section is to be formed is situated between segments of the selective area growth mask, or the selective area growth mask is formed on the GaAs substrate in such a manner that the laser activation section-forming region on the GaAs substrate has a predetermined width free of the selective area growth mask, and that the light emitting section-forming region contiguous with the laser activation section-forming region has a greater width free of the selective area growth mask than the predetermined width. Then, a multilayer semiconductor film is formed on the GaAs substrate according to metal organic chemical vapor deposition by using the selective area growth mask.

As a laser activation layer of the laser activation section and an optical waveguide layer of the light emitting section, both formed on the GaAs substrate, an $In_{1-x}Ga_xAs_yP_{1-y}$ layer is formed by selective area growth, where x indicates the proportion of Group III elements satisfying the relation of 0<x<1, and y indicates the proportion of Group V elements satisfying the relation of 0<y<1. Preferably, the proportion x of the Group III elements falls within the range of 0.5 to 0.8.

In this case, in order to set with precision the length of an optical waveguide which is given transparency with respect to the laser oscillation wavelength, the distance between an edge of the mask defining the laser activation section-forming region and a light emitting end face should desirably be 100 μm or more. Also, to provide an effective difference of film thickness between the laser activation section and the light emitting section during the selective area growth using the mask to thereby broaden the forbidden band of the optical waveguide of the light emitting section, the proportion of the Group III elements, especially the content of indium (In) which can cause a large difference of selective growth rate dependent on the mask, should preferably be increased to such an extent that no characteristic deterioration takes place.

DETAILED DESCRIPTION OF THE PREFERRED EMBODIMENTS

A semiconductor laser according to the present invention is obtained by the integrated formation of a laser activation section and a light emitting section contiguous thereto, as a multilayer film with a varying thickness on an n-type GaAs substrate, for example, by means of a metal organic chemical vapor deposition process using a selective area growth mask. A laser activation layer of the laser activation section and an optical waveguide layer of the light emitting section, in particular, are formed out of an InGaAsP layer with different thicknesses. The oscillation wavelength of the laser activation layer is 0.8 to 1.1 μm, preferably 6.98 μm. Also, the forbidden band of the optical waveguide layer is broadened in order to impart transparency with respect to the laser oscillation wavelength to the optical waveguide layer and thereby permit increase of the output.

The semiconductor laser having the above-described structure is produced by making the most use of the metal organic chemical vapor deposition process employing a selective area growth mask, as explained below. By suitably selecting the composition of the multilayer semiconductor film selectively grown on the GaAs substrate; moreover, it is possible to fabricate semiconductor lasers with high reliability by a simple process. Also, the characteristics of the semiconductor laser can be improved.

Figure 1:
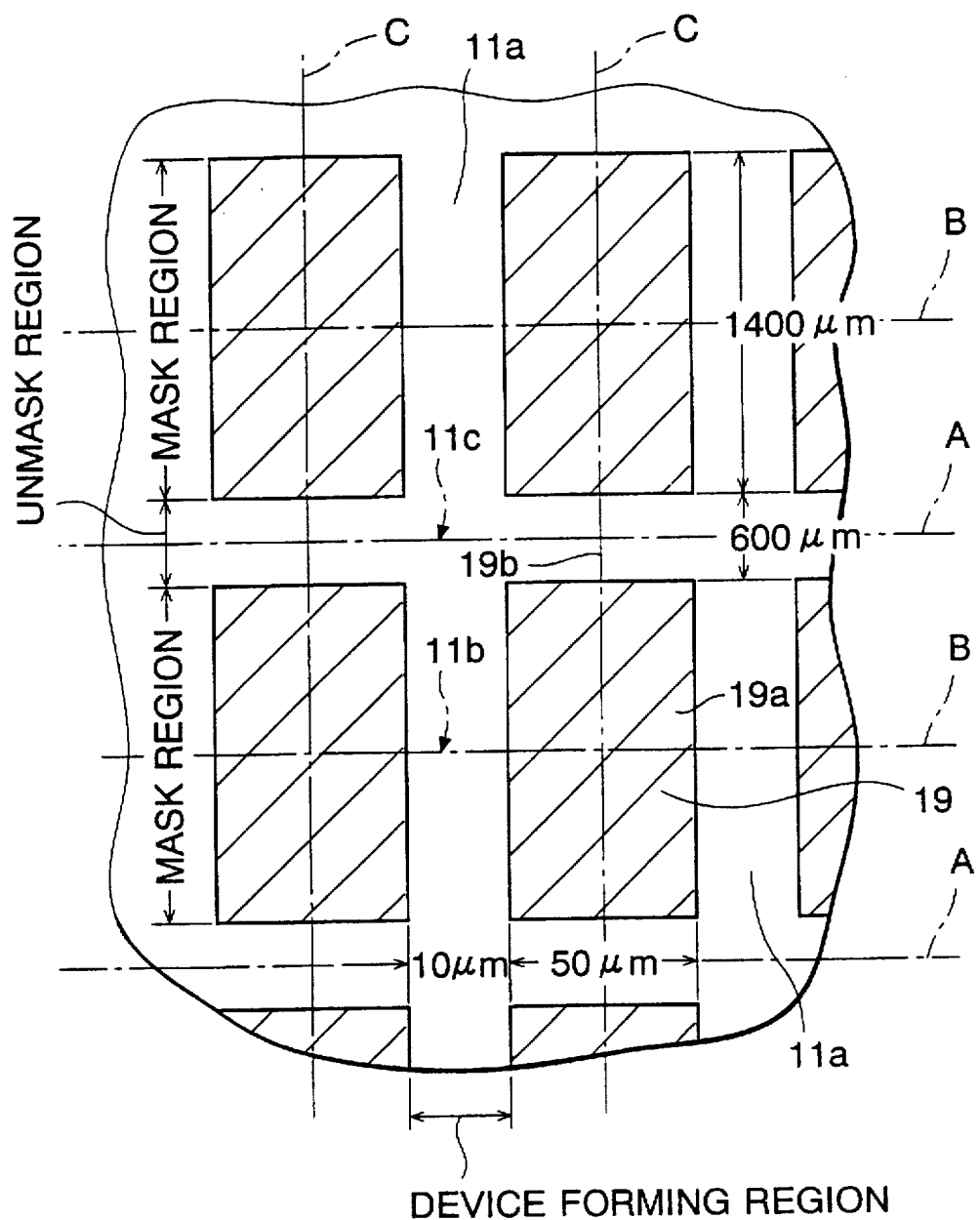
FIG. 1 is a plan view showing a pattern of a selective area growth mask used in producing a semiconductor laser according to one embodiment of the present invention.

FIG. 1 shows in plan view the pattern of a mask 19 for selective area growth used in producing a semiconductor laser according to the present invention. The mask 19 is formed as an array of rectangular mask segments by subjecting a SiO₂ film of about 100 nm thick, grown on an n-type GaAs substrate 11, for example, by plasma CVD (chemical vapor deposition), to patterning by means of a photolithography process using hydrofluoric acid as a buffer.

The selective area growth mask 19 performs an important function in adjusting the thicknesses of an InGaP layer and quantum well layer grown on the n-type GaAs substrate 11 by metal organic chemical vapor deposition (MOCVD). Especially, the mask 19 performs an important function in growing the multilayer film with a varying thickness on regions of the GaAs substrate 11 where the laser activation section and the light emitting section are to be formed. Therefore, the mask 19 is formed so that it may have a pattern defining the laser activation section-forming region and the light emitting section-forming region.

More specifically, the selective area growth mask 19 is formed as parallel mask segments 19a located along individual regions of the GaAs substrate 11 where semiconductor lasers are to be formed in such a manner that each of multiple rows (stripes) of device forming regions 11a of 10 μm wide, for example, is situated between the mask segments 19a. The rectangular mask segments 19a of the selective area growth mask 19 separate adjacent ones of the device forming regions 11a from each other and each have a width of 50 μm and a length of 1400 μm. It should be noted in particular that the rectangular mask segments 19a are arranged such that laser activation section-forming regions (laser activation regions) 11b, which are defined in the stripe-like device forming regions 11a, are situated between the mask segments 19a. An unmasked region 19b of 600 μm long is provided on each side of a light emitting section-forming region 11c contiguous to the laser activation section.

In the case where two semiconductor lasers are to be formed on each laser activation section-forming region 11b with their laser activation sections laid out back to back (facing in opposite directions), for example, the length of each rectangular mask segment 19a (laser device region 11b) is set to a value twice the longitudinal length (laser activation region length) of the laser activation section of the semiconductor laser to be formed. The longitudinal length of the unmasked region 19b is set to a value twice or more the length of the light emitting section (optical waveguide) contiguous to the laser activation section. Shortly, in the illustrated example, semiconductor lasers which each have a laser activation region length of 700 μm and in which the light emitting section contiguous to the laser activation region has a waveguide length of 300 μm are continuously formed on each row of the device forming regions 11a having a width of 10 μm, and to this end, the rectangular mask segments 19b each having a width of 50 μm and a length of 1400 μm are arrayed with a longitudinal space of 600 μm such that the individual device forming regions 11a are situated between the mask segments 19b.

Figure 2A:
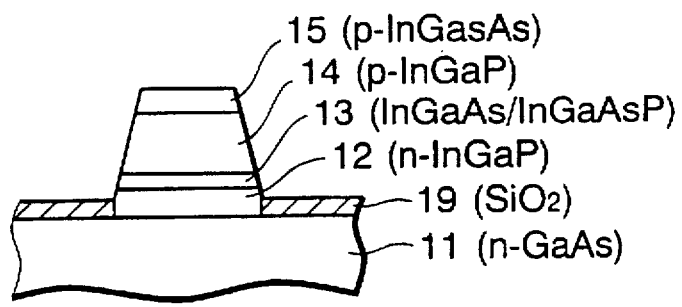
FIG. 2A is a sectional view showing a structure of a multilayer film grown on a GaAs substrate in section in a width direction across mask segments, for illustrating a semiconductor laser production process according to one embodiment of the present invention.

After the selective area growth mask 19 having the aforementioned pattern is formed on the n-type GaAs substrate 11, semiconductor layers mentioned below are successively and selectively grown on the n-type GaAs substrate 11 according to, for example, a metal organic chemical vapor deposition (MOCVD) process under reduced pressure, by using the mask 19. Specifically, as shown in FIG. 2A which illustrates the device structure sectioned in the width direction across mask segments, an n-type InGaP layer is first grown as a lower cladding layer 12, and an InGaAs/InGaAsP layer, for example, is grown on the layer 12 as a laser activation layer 13 including a light confinement layer and a strain quantum well layer. Then, a p-type InGaP layer as an upper cladding layer 14 is grown on the laser activation layer 13, and finally a p-type InGaAs layer is grown as a contact layer 15.

Figure 3A:
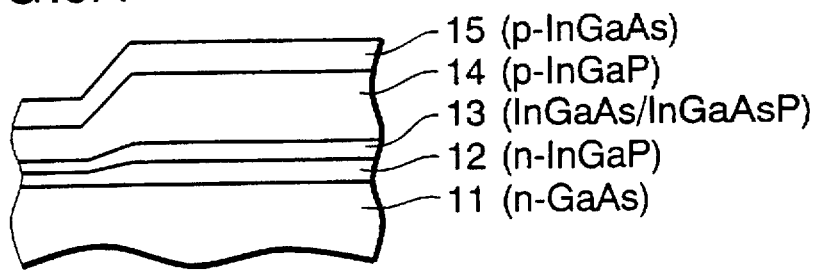
FIG. 3A is a sectional view of the multilayer film sectioned in a longitudinal direction along a device forming region, for illustrating variation in thickness of the multilayer film grown on the GaAs substrate.

In this case, the multilayer film is not formed on the selective area growth mask 19, as shown in FIG. 2A. Further, as shown in FIG. 3A illustrating the device structure sectioned in the longitudinal direction across the device forming region 11a, the light emitting section-forming region 11c, which is not situated between the rectangular mask segments 19b (in other words, situated between the unmasked regions 19b), has a film thickness smaller than that of the laser activation section-forming region 11b situated between the rectangular mask segments 19b of the selective area growth mask 19, due to the inherent nature of the selective area growth process having dependence on the selective area growth mask 19. Also, indium (In), which is a Group III element, is actively introduced into the laser activation section-forming region 11b, thus providing a narrow forbidden band (small bandgap energy), whereas the quantity of In introduced into the light emitting section-forming region 11c, which is not situated between the segments of the selective area growth mask 19, is restricted, so that its forbidden band is broad (the bandgap energy is large).

Figure 2B:
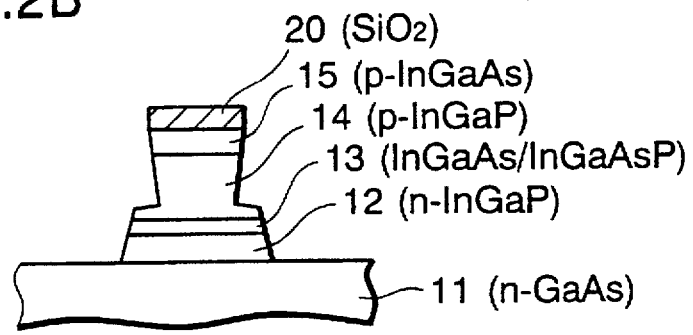
FIG. 2B is a sectional view showing a device structure after the multilayer film is etched into an inverted-mesa shape by using an etching mask.

With the multilayer film formed in the aforementioned manner, the selective area growth mask 19 is removed using hydrofluoric acid as a buffer, and then a SiO₂ film is again formed over the entire surface of the structure by a plasma CVD process. Subsequently, the SiO₂ film is partly removed by photolithography using hydrofluoric acid as a buffer such that the SiO₂ film is left only on the contact layer 15 to obtain an etching mask 20, as shown in FIG. 2B. Using the etching mask 20, the multilayer film is partly etched from the contact layer 15 down to an intermediate portion of the upper cladding layer 14, as shown in FIG. 2B, so that the multilayer film formed on each row of the device forming regions 11a (the laser activation section-forming regions 11b and the light emitting section-forming region 11c) has the shape of an inverted mesa. Tartaric acid is used as an etchant for etching the InGaAs layer, and hydrochloric acid is used as an etchant for etching the InGaP layer.

Figure 3B:
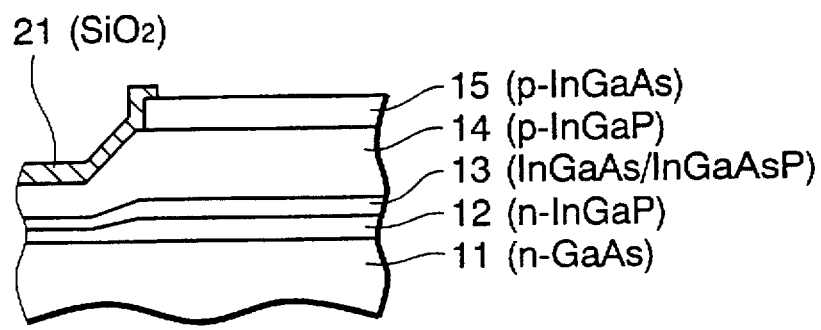
FIG. 3B is a sectional view showing a device structure after a current blocking layer of a $SiO_2$ film is formed at a light emitting section.

Then, the etching mask 20 on the light emitting section-forming region 11c is removed, and using the etching mask 20 remaining on the laser activation section-forming region 11b, the contact layer 15 on the light emitting section-forming region 11c is removed, followed by the removal of the remaining etching mask 20. Subsequently, as shown in FIG. 3B, a SiO₂ film is formed only on the region (light emitting section-forming region 11c) from which the contact layer 15 has been removed, thereby obtaining a current blocking layer 21. The current blocking layer 21 may be formed by first forming an SiO₂ film over the entire surface of the multilayer film and then etching the SiO₂ film in such a manner that the film is left only on the region from which the contact layer 15 has been removed.

Figure 2C:
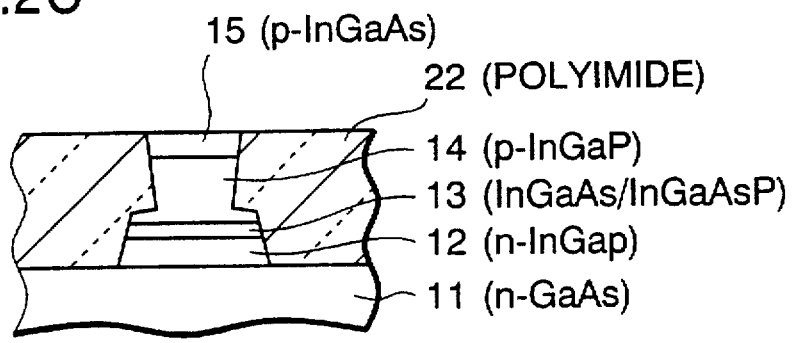
FIG. 2C is a sectional view showing a device structure after a current cutoff layer of a polyimide film is formed on each side of the inverted mesa-shaped multilayer film.

A polyimide film, which serves as a current cutoff layer 22, is formed on each side of the inverted mesa-shaped multilayer film, as shown in FIG. 2C.

Figure 3C:
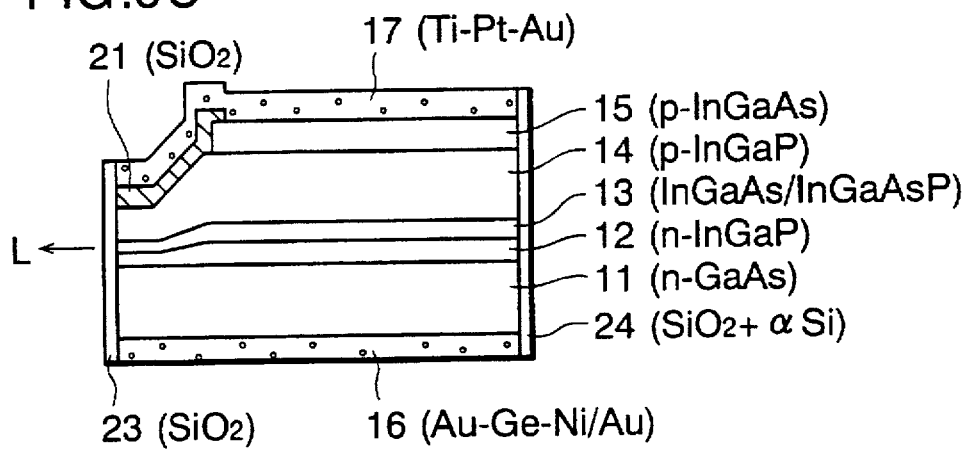
FIG. 3C is a sectional view showing a device structure after electrodes and reflecting films of the semiconductor laser are formed.

After the current blocking layer 21 and the current cutoff layer 22 are formed in the above manner, the back surface or underside of the n-type GaAs substrate 11 is polished such that the thickness of the substrate is reduced to about 100 μm, an Au-Ge-Ni/Au layer as a negative electrode 16, for example, is deposited on the back surface of the GaAs substrate 11, and a Ti-Pt-Au layer as a positive electrode 17 is deposited on the contact layer 15 and the current blocking layer 21, as shown in FIG. 3C.

Subsequently, the GaAs substrate 11 with the multilayer film formed thereon as described above is cleaved at the center (lines A in FIG. 1) of each unmasked region 19b situated between longitudinally adjacent segments of the selective area growth mask 19, and at the longitudinal center (lines B in FIG. 1) of the selective area growth mask 19, to thereby obtain laser diode bars whose cleaved faces serve as a light emitting surface and a light reflecting surface, respectively. Then, as shown in FIG. 3C, a $SiO_2$ film as a low-reflectivity film 23 having a reflectivity of 5% is formed on the surface (light emitting surface) cleaved along line A, and a high-reflectivity film 24 with a reflectivity of 95%, for example, a laminate of a $SiO_2$ film and an amorphous silicon film, is formed on the surface (light reflecting surface) cleaved along line B.

Each of the laser diode bars is then cut at the boundary between adjacent semiconductor lasers in the width direction, that is, at the center (lines C in FIG. 1) of the selective area growth mask 19, to obtain individual semiconductor lasers, whereby semiconductor lasers each provided with a light emitting section having transparency with respect to the laser oscillation wavelength are finally obtained. The light emitting direction is indicated by arrow L in FIG. 3C.

In the semiconductor laser fabricated by the aforementioned steps, the optical waveguide layer of the light emitting section has a small In content and thus has a broad forbidden band (large bandgap energy), as compared with the laser activation layer of the laser activation section, and therefore, the waveguide layer exhibits transparency with respect to the laser oscillation wavelength. In addition, since the upper surface of the waveguide layer is covered with the current blocking layer 21, resistance to catastrophic optical damage (COD) is large, making it possible to increase the light output.

Figure 4:
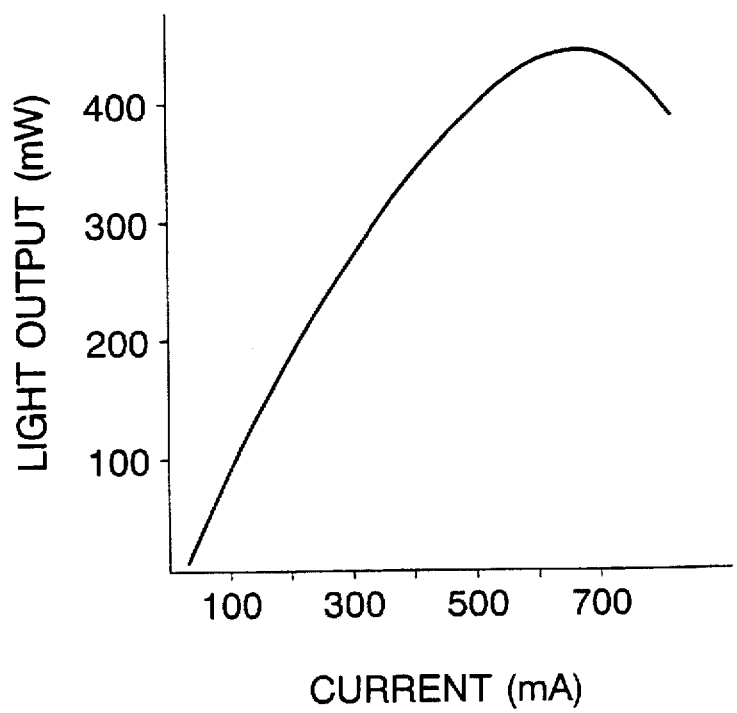
FIG. 4 is a graph showing a light output characteristic of a semiconductor laser according to an embodiment of the present invention.

For example, in a semiconductor laser with an oscillation wavelength of 0.98 μm produced following the aforementioned steps, the optical waveguide at the light emitting section had a considerably large forbidden band of about 0.88 μm. Consequently, even when an excitation current of 600 mA or more was passed through the semiconductor laser to obtain a light output of 400 mW or more, no catastrophic optical damage was observed, as seen from the light output characteristic shown in FIG. 4, for example. By contrast, a semiconductor laser produced by conventional techniques is destroyed due to catastrophic optical damage (COD) when a current is passed to obtain a light output as low as about 200 mW.

Figure 5:
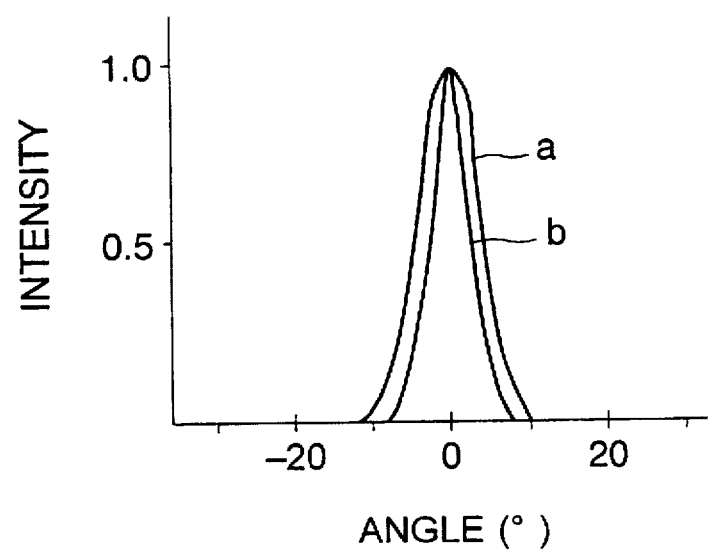
FIG. 5 is a graph showing an intensity distribution characteristic of a light beam emitted from the semiconductor laser according to an embodiment of the present invention.

Further, in the semiconductor laser with an oscillation wavelength of 0.98 μm fabricated in the above-described manner, the optical waveguide region with a large forbidden band has a length of 300 μm or more (the distance between longitudinally adjacent segments of the selective area growth mask 19 is 600 μm), and therefore, the spot size can be enlarged. Also, light emitted from the light emitting surface of the semiconductor laser had an intensity distribution such that the far field patterns in the vertical direction (characteristic a) and in the horizontal direction (characteristic b) were 10° and 7°, respectively, as shown in FIG. 5. As will be understood from these characteristics, the semiconductor laser according to the present invention can emit a narrow circular beam, compared with the conventional semiconductor laser.

Generally, the masking effect achieved by the selective area growth mask 19 during the vapor growth by MOCVD is prominent in the case where a Group III material, especially indium (In), is used, and is relatively low where gallium (Ga) is used. Accordingly, with a conventional semiconductor laser having an ordinary oscillation wavelength of 1 μm or thereabouts and using $In_{1-x}Ga_xAs$ (x=0.8 to 0.9) as its strain quantum well layer, a sufficiently high selective area growth effect sometimes cannot be expected because of a small In content. However, if the In content, for example, is increased in order to enhance the selective area growth effect, another problem arises in that large strain is caused when the laser oscillation wavelength is set to a desired value.

Figure 6:
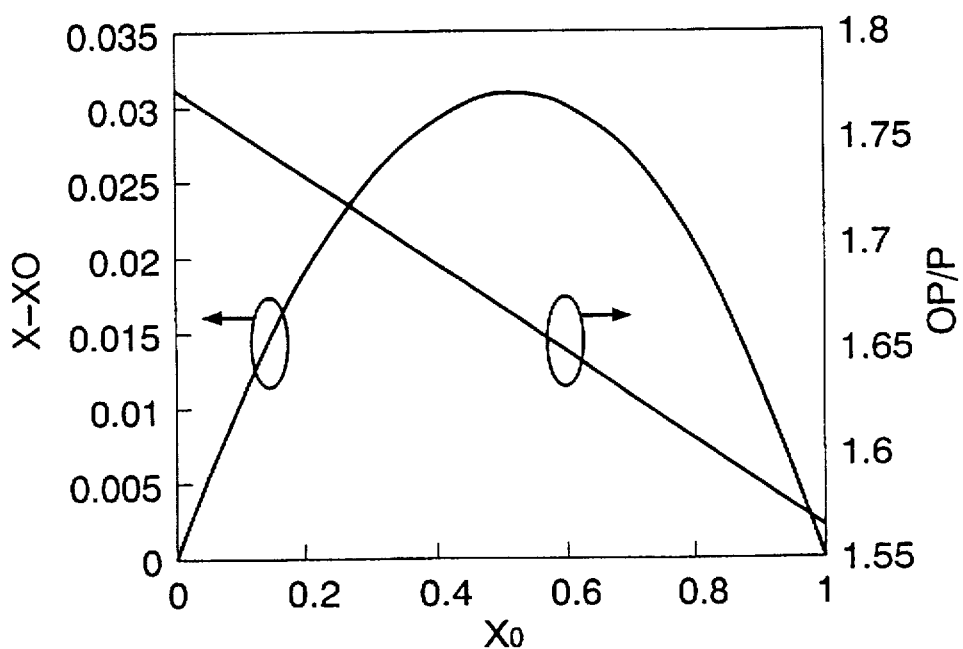
FIG. 6 is a graph illustrating advantageous effects of the semiconductor laser according to the present invention, or more specifically, the difference in the proportion of Group III elements between a mask region and a flat region grown by selective area growth, and the dependence of the film thickness ratio on a Group III element proportion $x_0$.

Therefore, in the semiconductor laser according to the present invention, $In_{1-x}Ga_xAs_yP_{1-y}$ (x=0.7; y=0.65), for example, is used especially for the strain quantum well layer (laser activation layer). Specifically, where the selective area growth mask 19 of 50 μm wide is formed with a gap of 10 μm, the proportion x of the Group III element composition grown on the region (laser activation section-forming region, hereinafter referred to as "mask region") situated between the segments of the mask 19 and the proportion $x_0$ of the Group III element composition grown on the region (light emitting section-forming region, hereinafter referred to as "flat region") where no mask 19 is formed have a difference $x-x_0$ as shown in FIG. 6. Also, the dependence of the film thickness ratio $d/d_0$ on the proportion $x_0$ of the Group III element composition is shown in FIG. 6.

In the case of the aforementioned $In_{1-x}Ga_xAs_yP_{1-y}$, the Group III composition x can be expressed as Ga/(Ga+In), and in FIG. 6, the In content is indicated so as to increase in the leftward direction along the horizontal axis. Therefore, FIG. 6 reveals that the higher the In content, the greater the film thickness ratio becomes, and that the film thickness difference increases due to the masking effect achieved by the selective area growth. It can also be seen that the difference $(x-x_0)$ in proportion between the compositions is the greatest where the In and Ga contents are almost the same.

Figure 7:
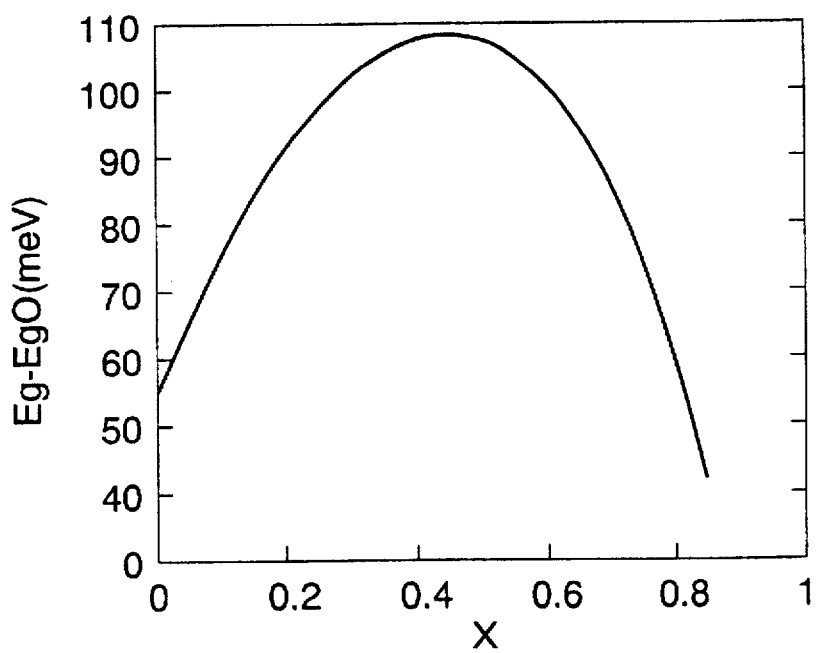
FIG. 7 is a graph also illustrating an advantageous effect of the semiconductor laser according to the present invention, or more specifically, the bandgap energy differences between the mask region and the flat region observed when InGaAsP quantum well layers are formed with a Group III element proportion x varied.

Based on these findings, quantum wells each having an $In_{1-x}Ga_xAs_yP_{1-y}$ layer were formed with the proportion x of the Group III element composition varied, and they showed differences $Eg-Eg_0$ of the bandgap energy between the mask region and the flat region as shown in FIG. 7. In this case, the composition of the Group V elements was selected so that the mask region had a film thickness of 9 nm and that the laser oscillation wavelength (light emission wavelength) was 0.97 μm.

Since the bandgap of the quantum well layer is determined by its film thickness and composition, the amount of change in the bandgap is affected by both the difference in proportion between the aforementioned compositions and the film thickness difference shown in FIG. 6. Accordingly, the amount of change in the bandgap (forbidden band) attained by the selective area growth using the mask 19 greatly depends on the Group III element composition of the quantum well layer.

In the case of an InGaAs quantum well layer (x=0.85) ordinarily used in conventional semiconductor lasers, the film thickness is increased by about 1.59 times by the masking effect and the composition change is approximately x=0.85→0.84. The amount of change of the bandgap in this case is approximately 40 meV in the case where the mask region is 970 nm and the flat region is 940 nm. By contrast, in the case of the InGaAsP quantum well layer (x=0.7; y=0.65) used in the semiconductor laser according to the present invention, the film thickness can be increased by 1.63 times by the masking effect and a large composition change of x=0.7→0.55 is observed. Also, the amount of change of the bandgap in this case is as large as 75 meV where the mask region is 970 nm and the flat region is 910 nm, thus making it possible to almost double the amount of change in the bandgap compared with the aforementioned InGaAsP quantum well layer.

Under the conditions of the characteristics shown in FIG. 6, the amount of change in the bandgap is the greatest when the proportion x of the Group III element composition is in the vicinity of 0.45. From this it can be seen that the range for the proportion of the Group III element composition in which the bandgap can expectedly be changed by twice or more as compared with the InGaAsP quantum well layer is from 0.15 to 0.7, and that the range for the proportion of the Group III element composition in which the bandgap can expectedly be changed by 1.5 times or more is from 0.05 to 0.78. If, however, the proportion x is too small, correspondingly large strain is caused; therefore, the range for the proportion x of the composition in which excellent characteristics can be expected in practice is from about 0.5 to 0.8.

Thus, to fabricate a high-output semiconductor laser with an oscillation wavelength of 0.98 μm, more preferably, a SiN dielectric film is formed over the entire surface of an n-type GaAs substrate, for example, which is then subjected to a patterning to form a selective area growth mask 19 with a width of 50 μm and a gap of 10 μm (between adjacent rectangular mask segments 19b). Then, using the selective area growth mask 19, an n-type InGaP lower cladding layer is grown by 2 μm by the selective area growth.

Subsequently, a 40 nm-thick InGaAsP layer having the bandgap wavelength (1.55 eV) is formed as a light confinement layer on the grown lower cladding layer, and an InGaAsP strain quantum well layer of 6 nm thick is formed such that the proportions x and y of the Group III and V compositions in the aforementioned flat region are 0.7 and 0.65, respectively. Further, a 40 nm-thick InGaAsP layer with the bandgap wavelength (1.55 eV) is grown as a light confinement layer, so that it serves as the laser activation layer/optical waveguide layer.

After a p-type InGaP upper cladding layer is grown by 2 μm, the selective area growth mask 19 is removed, and then a p-type InGaAs contact layer is grown by 0.5 μm. The n-type InGaP lower cladding layer and the p-type InGaP upper cladding layer are individually formed in two steps on different regions, whereby strain can be suppressed.

Subsequently, the contact layer on the flat region is removed, a dielectric film of SiN or the like is formed over the entire surface, and an etching process is carried out by photolithography using a striped mask, thereby forming an optical waveguide having a ridge structure. An insulating film is then formed, and after a current injection region is formed by etching, positive and negative electrodes are formed respectively on the current injection region and the lower surface of the substrate, and reflecting films with 5% and 95% reflectivity are formed on the front and rear end faces, respectively, thereby completing the fabrication of the semiconductor laser.

In the semiconductor laser fabricated by utilizing the selective area growth as described above and having the aforementioned compositions and structure, the laser activation layer of the mask region has a light emission wavelength of 0.98 μm and the optical waveguide layer (laser activation layer) of the flat region has a light emission wavelength of 0.91 μm, thus making it possible to impart transparency with respect to the laser oscillation wavelength (0.98 im) to the light emitting section. Further, in the case where the width of the activation region was set to 4 μm and the resonator length was set to 1000 μm (activation region length: 800 μm; light emitting region length 200 μm), the oscillation threshold current could be set to a low value of 25 mA and the quantum efficiency via the front end face on which the reflecting film with 5% reflectivity was formed was 1 W/A. It was also confirmed that no catastrophic optical damage was caused even when current was injected at 1 A or higher, proving excellent characteristics.

By contrast, in a semiconductor laser using InGaAs as the activation region, the flat region has a light emission wavelength of 0.94 μm, and since the laser oscillation light is absorbed, the basic characteristics of the semiconductor laser, such as oscillation threshold current, quantum efficiency, temperature characteristic, etc., are adversely affected, making it impossible to achieve such excellent characteristics as obtained by the semiconductor laser having the aforementioned InGaAsP activation layer.

Further, with the semiconductor laser according to the present invention, the emitted light beam can be narrowed to such an extent that the half value width is approximately 20°, as mentioned above. Therefore, by using a lens system in combination with the semiconductor laser, for example, it is possible to easily enhance the coupling efficiency with a single-mode optical fiber up to 90% or more. In this case, if the light beam is made more circular by tapering the ridge width of the light emitting region, for example, the coupling efficiency can be further improved.

In a semiconductor laser device according to a more preferred embodiment of the present invention, intermediate layers are desirably formed above and below the activation layer, respectively, by selective area growth. Namely, each cladding layer should have a certain film thickness so as to attain its function; however, if the InGaP layer is formed by the selective area growth as mentioned in the above embodiment, a difference in the In content ratio arises between the region provided with the mask and the region with no mask. This can cause a situation where strain is liable to be caused in either the laser activation section or the light emitting section. To form the InGaP cladding layer without entailing strain, therefore, the cladding layer should desirably be formed by a process other than the selective area growth. If, however, the laser activation layer/optical waveguide layer alone is formed by the selective area growth and the InGaP cladding layer is grown without using a mask, the mask must be formed and removed, respectively, before and after the formation of the laser activation layer/optical waveguide layer. This causes a problem that the laser activation layer/optical waveguide layer is liable to be damaged especially when the mask is removed.

Figure 8:
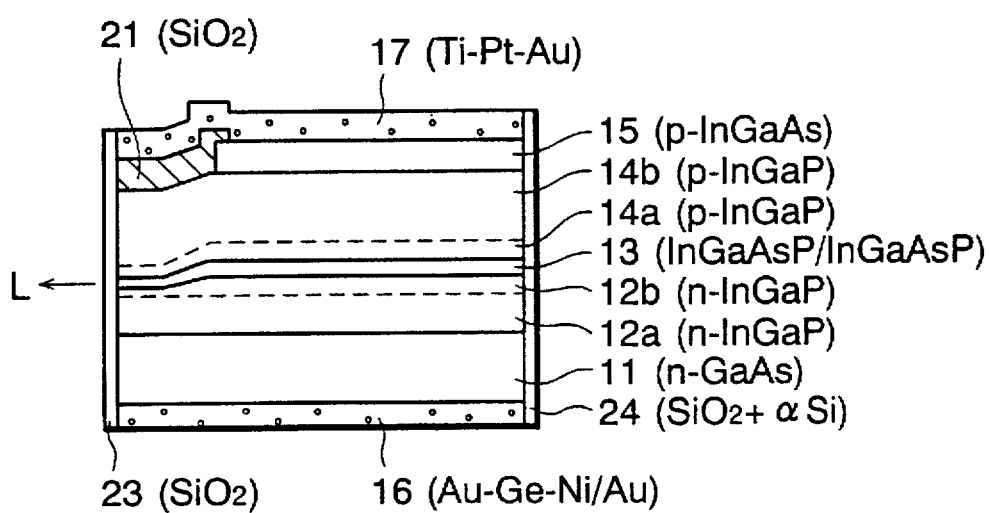
FIG. 8 is a diagram showing a semiconductor laser structure according to a preferred embodiment of the present invention.

Accordingly, when fabricating a high-output semiconductor laser with an oscillation wavelength of 0.98 μm, a device structure shown in FIG. 8, for example, may be used. More specifically, an n-type InGaP lower cladding layer 12a of 2 μm thick is first formed on an n-type GaAs substrate 11, for example. Then, a SiN dielectric film is formed over the entire surface of the lower cladding layer 12a, and patterning is carried out to form a selective area growth mask 19 with a width of 50 μm and a gap of 10 μm (between adjacent rectangular mask segments 19b).

Then, using the selective area growth mask 19, an n-type InGaP lower cladding layer 12b is grown by 0.1 μm according to the selective area growth.

Subsequently, a 40 nm-thick InGaAsP layer having the bandgap wavelength (1.55 eV) is formed as a light confinement layer on the grown lower cladding layer, and an InGaAsP strain quantum well layer of 6 nm thick is formed such that the proportions x and y of the Group III and V compositions in the aforementioned flat region are 0.7 and 0.65, respectively. Further, a 40 nm-thick InGaAsP layer with the bandgap wavelength (1.55 eV) is grown as a light confinement layer, so that it serves as the laser activation layer/optical waveguide layer.

Then, a p-type InGaP upper cladding layer 14a is grown by 0.1 μm on the InGaAsP layer.

After the selective area growth mask 19 is removed, a p-type InGaP upper cladding layer 14b is grown by 2 μm over the entire surface, and a p-type InGaAs contact layer 15 is grown by 0.5 μm on the upper cladding layer 14b.

Subsequently, the contact layer on the flat region is removed, a dielectric film of SiN or the like is formed over the entire surface, and an etching process is carried out by photolithography using a striped mask, thereby forming an optical waveguide having a ridge structure. An insulating film is then formed, and after a current injection region is formed by etching, positive and negative electrodes 17 and 16 are formed respectively on the current injection region and the lower surface of the substrate, and reflecting films 13 and 24 with 5% and 95% reflectivity are formed on the front and rear end faces, respectively, thereby completing the fabrication of the semiconductor laser.

As described above, the n-type InGaP lower cladding layer 12a, 12b and the p-type InGaP upper cladding layer 14a, 14b are individually formed in two steps, whereby strain of the cladding layers can be prevented. Especially, after forming the thick n-type InGaP lower cladding layer 12a which forms a main part of the lower cladding layer, the n-type InGaP lower cladding layer 12b, the laser activation layer/optical waveguide layer 13, and the p-type InGaP upper cladding layer 14a are formed by a selective area growth process using the selective area growth mask 19. Then, the selective area growth mask 19 is removed by etching, and the thick p-type InGaP upper cladding layer 14b, which constitutes a main part of the upper cladding layer, is formed. It is therefore possible to form cladding layers of which the characteristics are stable.

If, on the other hand, the laser activation layer/optical waveguide layer 13 alone is formed by a selective area growth process using the selective area growth mask 19, the laser activation layer/optical waveguide layer 13 may possibly be roughened and thus its characteristics are deteriorated when the selective area growth mask 19 is removed by etching after the growth of the laser activation layer/optical waveguide layer 13. Also in view of this, the individual cladding layers should preferably be formed in two steps, as mentioned above, to ensure the quality of the laser activation layer/optical waveguide layer 13.

Figure 9A:
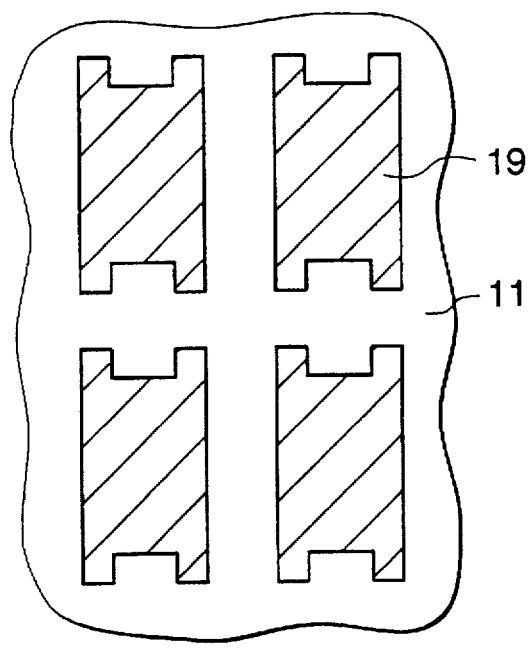
FIG. 9A is a plan view showing a modification of the selective area growth mask pattern.
Figure 9B:
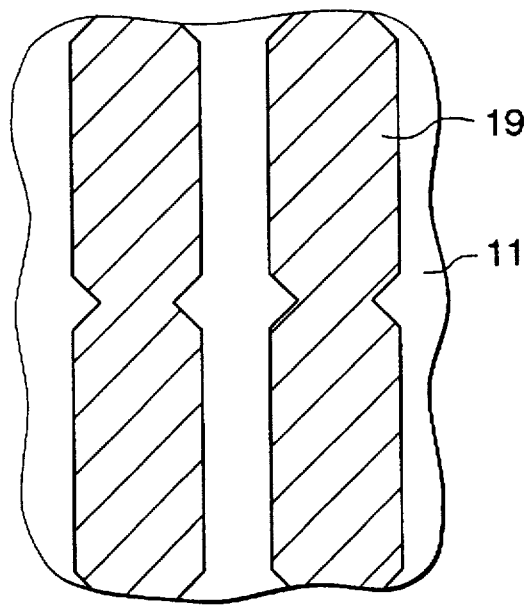
FIG. 9B is a plan view showing another modification of the selective area growth mask pattern.
Figure 10:
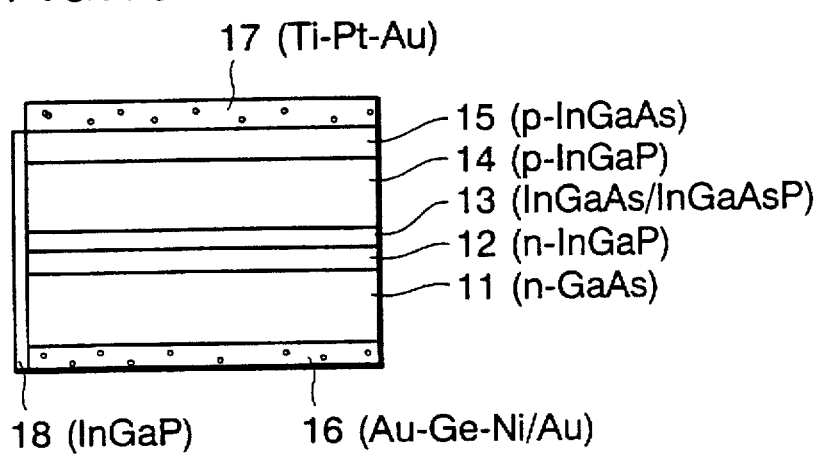
FIG. 10 is a sectional view showing a conventional structure of a semiconductor laser.

The present invention is not limited to the embodiment described above. For example, the selective area growth mask 19 may have patterns as shown in FIGS. 9A and 9B. In brief, since the rate of vapor growth of films (film thicknesses) on the mask region and on the flat region varies depending on the mask width and the width of a gap between mask segments, the mask width (width of the gap between mask segments) at the laser device-forming region and the light emitting section-forming region should only be changed in accordance with the required film thicknesses etc.

In the above embodiment, a ridge-type semiconductor laser is explained by way of example, but an embedded type structure or a ridge-embedded type structure may be employed instead. Also, in the embodiment, the gap (spacing) between mask segments 19 is set to 10 μm, and the activation layer formed along the gap by the selective area growth is etched into an inverted-mesa shape to obtain a laser activation region. Alternatively, the gap width may of course be set to a value almost equal to the actual width of the laser activation layer so that the entirety of the activation layer formed by the selective area growth may be used as the laser activation region. Further, although in the above embodiment, the activation layer is formed as a single quantum well layer, it may have a multilayer quantum well structure having two or more layers.

Furthermore, instead of using InGaAsP as the light confinement layer, GaAsP may be used, and also in this case similar effects can be obtained. The activation layer of the embodiment involves a compression strain of about +1.5%; therefore, if InGaAsP or GaAsP having extension strain is used so that the strain of the activation layer is compensated for, the crystallization performance is enhanced, improving the characteristics.

Also, instead of InGaP, AlGaAs may of course be used for the cladding layer. Further, if a thin AlAs layer is formed in the cladding layer and after the formation of ridges, the light emitting section is subjected to selective oxidation, then the current blocking with respect to the light emitting section can be ensured with higher reliability.

Further, by tapering the ridge width of the light emitting section to optimize the selective oxidation condition, it is possible to cause a current corresponding to the distance from the activation region to flow only to the light emitting section in the vicinity of the activation region. Specifically, according to selective area growth techniques generally employed, a transition region is produced between the mask region and the flat region, and therefore, distance-dependent light absorption occurs at the light emitting section in the vicinity of the activation region, causing the possibility of the device characteristics being deteriorated. With the structure described above, such inconveniences can be eliminated.

According to the present invention, therefore, not only the manufacturing process is simplified but also a semiconductor laser having improved characteristics and capable of high output can be provided. In addition, since the light emitting section has transparency with respect to the laser oscillation wavelength, the spread angle of the emitted light can be controlled so as to obtain a nearly circular light beam having a sufficiently narrow far field pattern, whereby the coupling efficiency with an optical fiber and other characteristics can be enhanced.

In particular, since the activation layer of InGaAsP is formed on the GaAs substrate, it is possible to fabricate with high reliability and ease high-output semiconductor lasers with an oscillation wavelength of 0.8 to 1.1 μm, which wavelength is required when the device is used as an optical repeater.

What is claimed is:

1. A semiconductor laser with a multilayer structure formed on a GaAs substrate, comprising:

a laser activation section and a light emitting section simultaneously formed by a metal organic chemical vapor deposition process using a selective area growth mask to produce an effect that said laser activation section and said light emitting section differ in film thickness, said laser activation section including a laser activation layer whose laser oscillation wavelength is 0.8 to 1.1 μm, and said light emitting section including an optical waveguide layer, the optical waveguide layer having a broad forbidden band compared with the laser activation layer and having transparency with respect to the laser oscillation wavelength.

2. The semiconductor laser according to claim 1, wherein the laser activation layer of said laser activation section and the optical waveguide layer of said light emitting section each comprise an $In_{1-x}Ga_xAs_yP_{1-y}$ layer, where x indicates a proportion of Group III elements satisfying a relation of $0<x<1$, and y indicates a proportion of Group V elements satisfying a relation of $0<y<1$.

3. The semiconductor laser according to claim 2, wherein the proportion x of the Group III elements in the $In_{1-x}Ga_xAs_yP_{1-y}$ layer falls within a range of 0.5 to 0.8.

4. A process of producing a semiconductor laser of multilayer structure provided with a light emitting section having transparency with respect to a laser oscillation wavelength of 0.8 to 1.1 μm, comprising:

forming a pair of selective area growth masks on a GaAs substrate except for a region where a light emitting section is to be formed in such a manner that a region where a laser activation section is to be formed is situated between said pair of selective area growth masks; and forming multiple semiconductor layers on said laser activation section-forming region of the GaAs substrate by metal organic chemical vapor deposition by using the selective area growth masks, said multiple semiconductor layers comprising a laser activation layer of a laser activation section having a laser oscillation wavelength band of 0.8 to 1.1 μm, and wherein said laser activation section and said light emitting section are simultaneously formed by said metal organic chemical vapor deposition process.

5. The process according to claim 4, wherein said multiple semiconductor layers, which are formed on the GaAs substrate by metal organic chemical vapor deposition and function as a laser activation layer of the laser activation section and an optical waveguide layer of the light emitting section, are obtained by growing an $In_{1-x}Ga_xAs_yP_{1-y}$ layer, where x indicates a proportion of Group III elements satisfying a relation of $0<x<1$, and y indicates a proportion of Group V elements satisfying a relation of $0<y<1$.

6. A process of producing a semiconductor laser of multilayer structure provided with a light emitting section having transparency with respect to a laser oscillation wavelength of 0.8 to 1.1 μm, comprising:

forming selective area growth masks on a GaAs substrate in such a manner that a laser activation section-forming region on the GaAs substrate where a laser activation section is to be formed has a predetermined width free of the selective area growth masks, and such that a light emitting section-forming region contiguous with the laser activation section-forming region has a greater width free of the selective area growth masks than the predetermined width; and forming multiple semiconductor layers on said laser activation section-forming region of the GaAs substrate by metal organic chemical vapor deposition by using the selective area growth masks, said multiple semiconductor layers comprising a laser activation layer of the laser activation section having a laser oscillation wavelength band of 0.8 to 1.1 μm, and wherein said laser activation section and said light emitting section are simultaneously formed by said metal organic chemical vapor deposition process.

7. The process according to claim 6, wherein said multiple semiconductor layers, which are formed on the GaAs substrate by metal organic chemical vapor deposition and function as a laser activation layer of the laser activation section and an optical waveguide layer of the light emitting section, are obtained by growing an $In_{1-x}Ga_xAs_yP_{1-y}$ layer, where x indicates a proportion of Group III elements satisfying a relation of $0<x<1$, and y indicates a proportion of Group V elements satisfying a relation of $0<y<1$.

* * * * *